United States Patent
Morrison et al.

(10) Patent No.: US 7,395,163 B1
(45) Date of Patent: Jul. 1, 2008

(54) METHOD OF DETECTING SYSTEM FUNCTION BY MEASURING FREQUENCY RESPONSE

(75) Inventors: John L. Morrison, Butte, MT (US); William H. Morrison, Manchester, CT (US)

(73) Assignee: Montana Tech of the University of Montana, Butte, MT (US)

( * ) Notice: Subject to any disclaimer, the term of this patent is extended or adjusted under 35 U.S.C. 154(b) by 0 days.

(21) Appl. No.: 11/825,629

(22) Filed: Jul. 5, 2007

Related U.S. Application Data

(63) Continuation of application No. 11/313,546, filed on Dec. 20, 2005, now abandoned.

(60) Provisional application No. 60/724,631, filed on Oct. 7, 2005, provisional application No. 60/637,969, filed on Dec. 20, 2004.

(51) Int. Cl.
*G01R 23/00* (2006.01)
*G06F 11/00* (2006.01)

(52) U.S. Cl. ............................ 702/75; 702/79; 702/117; 324/603

(58) Field of Classification Search .................. 702/117, 702/75, 79
See application file for complete search history.

(56) References Cited

U.S. PATENT DOCUMENTS 5,406,496 A * 4/1995 Quinn ......................... 702/106
5,946,482 A * 8/1999 Barford et al. ................ 703/14
6,307,378 B1 10/2001 Kozlowski
6,653,817 B2 11/2003 Tate, Jr. et al.

OTHER PUBLICATIONS

Smith et al., "Model validation approaches for nonlinear feedback systems using frequency response measurements", Dec. 7-10, 1999, IEEE Proceedings of the 38th IEEE Conference on Decision and Control, 1999, vol. 2, pp. 1500-1504.*
Nikolopoulos et al., "Accurate method of representation of high-voltage measuring systems and its application in high-impulse voltage measurements", Mar. 1989, IEEE, Science, Measurement and Technology, vol. 136, issue 2, pp. 66-72.*
FreedomCAR Battery Test Manual for Power-Assist Hybrid Electric Vehicles, Oct. 2003, Appendix D, DOE/ID-11069, Idaho National Laboratory.

(Continued)

*Primary Examiner*—Hal Wachsman
(74) *Attorney, Agent, or Firm*—Jean Kyle

(57) ABSTRACT

Real time battery impedance spectrum is acquired using one time record, Compensated Synchronous Detection (CSD). This parallel method enables battery diagnostics. The excitation current to a test battery is a sum of equal amplitude sin waves of a few frequencies spread over range of interest. The time profile of this signal has duration that is a few periods of the lowest frequency. The voltage response of the battery, average deleted, is the impedance of the battery in the time domain. Since the excitation frequencies are known, synchronous detection processes the time record and each component, both magnitude and phase, is obtained. For compensation, the components, except the one of interest, are reassembled in the time domain. The resulting signal is subtracted from the original signal and the component of interest is synchronously detected. This process is repeated for each component.

4 Claims, 12 Drawing Sheets

OTHER PUBLICATIONS

Fenton, Ronald C., Hohn, Justin T., Willson, Peter M., BSM Development Documentation, May 2005, Montana Tech of the University of Montana.

Morrison, William H., Intelligent Self-Evolving Prognostic Fusion, Jul. 29, 2005, NASA, Ames Research Center.

Albresht, Weston, Battery Complex Impedance Identification with Random Signal Techniques, May 4, 2005, Montana Tech of the University of Montana Tech of the University of Montana, 22 pages.

Morrison, John L., CSD Algorithms as MATLAB Code for Real Time Estimation of Battery Impedance, Sep. 2005, Montana Tech of the University of Montana.

Ziemer, Rodger E., Tranter, William H., Signals and Linear Systems, 2002, Chapter 2, pp. 56-123, Principles of Communication, 5th Ed., John Wiley & Sons.

Wasserman, Philip D., Radial Basis-Function Networks, 1993, Chapter 8, pp. 147-176, Van Nostrand Reinhold, New York, (no month).

Alpaydin, Ethem, Radial Basis Functions, 2004, Chapter 12.3, pp. 284-290, The MIT Press, Cambridge, Massachusetts, London, England.

* cited by examiner

METHOD OF DETECTING SYSTEM FUNCTION BY MEASURING FREQUENCY RESPONSE

CROSS-REFERENCE TO RELATED APPLICATIONS

This application is a continuation of U.S. patent application Ser. No. 11/313,546, filed Dec. 20, 2005, now abandoned, which claims the benefits of U.S. Provisional Patent Application Nos. 60/637,969, filed Dec. 20, 2004 and 60/724,631, filed Oct. 7, 2005. The disclosures of each of these applications are hereby incorporated by reference in their entirety, including all figures, tables and drawings.

The subject invention was made with government support under a research project supported by NASA, Grant No. NNA05AC24C. The government has certain rights in this invention.

BACKGROUND OF THE INVENTION

Electrochemical Impedance Measurement Systems use the Bode analysis technique to characterize the impedance of an electrochemical process. It is a well established and proven technique. The battery being evaluated is excited with a current that is single frequency and its response is measured. The process is repeated over a range of frequencies of interest until the spectrum of the impedance is obtained. The method is effective but time consuming, as the process is serial. A parallel approach using band width limited noise as an excitation current can obtain the same information in less time. The system response to the noise is processed via correlation and Fast Fourier Transform (FFT) algorithms and many such responses are averaged. The result is the spectrum of response over the desired frequency range. The averaging of many responses also makes this process somewhat serial. Another technique assembles the current noise waveform from a sum of sinusoids each at a different frequency. The system response as a time record is acquired and processed with the FFT algorithm. To reduce noise multiple time records of waveforms are processed and their resultant spectra averaged. This process is also serial.

There remains a need for real time acquisition of battery impedance for control and diagnostics over a limited frequency range. This method of acquisition should be a true parallel approach that uses a single time record of battery response with a duration compatible to a real time control process.

SUMMARY OF THE INVENTION

The invention involves using a parallel approach to analyze battery impedance or other system functions. A number of frequencies are selected over which the battery is to be tested. These frequencies are assembled into an excitation time record (ETR) that is the sum of the sinusoids of the frequencies and the length of such periods of the lowest of the frequencies. The ETR is conditioned to be compatible with the battery. The battery is then excited with the ETR and the response time record (RTR) is captured. The RTR is then synchronized to the ETR and processed by a series of equations to obtain a corrected time record (CTR). The CTR is reassembled to obtain an estimated corrected time record (ECTR). The ECTR is subtracted from the CTR to get an error. The error is minimized to achieve the frequency response estimate. Error is minimized using compensated synchronous detection (CSD) using a CSD algorithm which can be implemented by a neural network. The subject method allows a parallel implementation for swept frequency measurements to be made utilizing a composite signal of a single time record that greatly reduces testing time without a significant loss of accuracy.

DETAILED DESCRIPTION OF THE INVENTION

Figure 1:
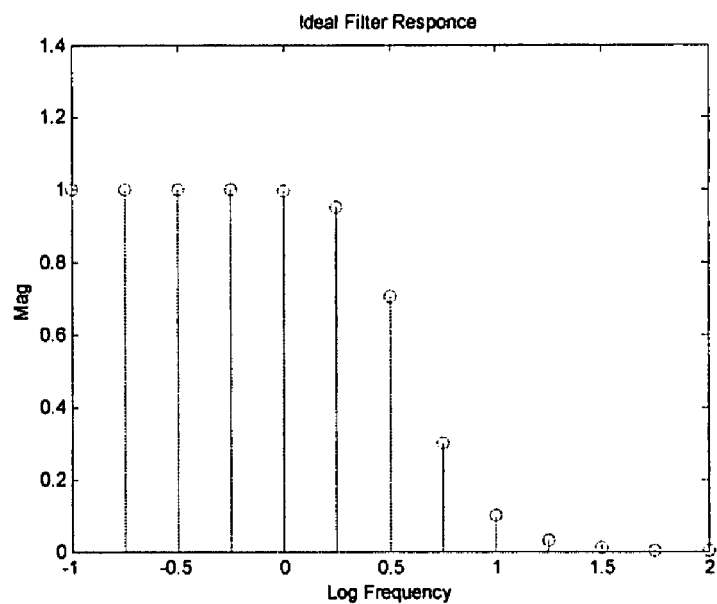
FIG. 1 shows the Filter Ideal Magnitude Response.

A system function can be identified over a limited number of specific frequencies. The desired frequencies are assembled as an excitation time record that is a sum of those sinusoids and have a length of several periods of the lowest frequency. The time step selected must be compatible with Shannon's sampling constraints for the highest frequency component. The individual waveforms should be sine waves of equal amplitude but alternating signs for a phase shift of 180 degrees between the components. Alternating 180 degree phase shift will minimize a start up transient. The RMS and the rogue wave peak (sum of the absolute values of all component peaks) of the assembled time record must be compatible with the system being excited and the Data Acquisition System (DAS) that will capture the response.

The Excitation Time Record (ETR), as a current for impedance identification or voltage for system function identification, is signal conditioned to be compatible with the Unit Under Test (UUT). As part of the signal conditioning, anti-aliasing filters insure that all frequencies generated by the digital to analog conversion process other than the intended frequencies are suppressed. The UUT is excited by the ETR and a time record of the UUT response is captured by the DAS. The UUT response time record (URTR) is synchronized to and the same length as the ETR.

In order to fit steady state sinusoidal response assumptions a pre-selected number of data points R at the beginning of the URTR must be discarded. In general the sum of those data points total to a time that is larger than the transient response time of the UUT at the front end of the ETR. The UUT corrected time response is referred to as the CTR.

The first estimate of components, magnitude and phase, of the frequency response is made by processing the URTR via Equations 3 through 10. It is important that a zero mean be established prior to processing with Equations 3 to 10 (see below).

The core of this whole concept is that an estimate of the UUT corrected time response, the CRT is made by reassembling the URTR using the estimates of the individual frequency components with the same time step and then discarding the first R time steps to become the ECRT. The difference between the CRT and the ECRT is an error and minimizing this error will increase the accuracy of the frequency response estimates.

A first approach to minimizing the error between the CRT and the ECRT is Compensated Synchronous Detection (CSD). The CSD algorithm synthesizes a residual time record of the original time record using the magnitudes of the in phase and quadrature components for each frequency except the one to be detected. This synthesized residual is then subtracted from the original time record. The resulting compensated time record is processed with synchronous detection and a new compensated estimate of the response at the detection frequency is obtained. Since all of the other components in this compensated time record are suppressed the error from leakage at those other frequencies is less. This process is repeated for each of the frequencies. Assembling the residual time record and generating the compensated time record are illustrated by Equations 11 and 12 (see below).

Another approach to minimize the error between the CRT and the ECRT is to use a Neural Network. The first estimate of the component magnitudes and phases is made as for the CSD technique. Those values are stored and the ECRT is calculated. This signal is then subtracted from the CRT to produce a response residual. The synchronous detection is then performed upon this residual and the component magnitudes and phases are again stored. These components are then used to reconstruct an estimate of the residual signal. This estimated residual signal is subtracted from the initial residual signal to produce a residual, residual signal. This is then synchronously detected and the loop starts again. This is repeated as many times as desired, each time with the resultant components being stored. The assumption is that there is a functional relationship between these resultant components and the true system response. A neural network is then used to determine this relationship. The previously stored results become the test dataset for the neural network. The network has been trained previously on a similar unit and a known ideal response (e.g. battery impedance measured using electrochemical impedance spectroscopy). The output of the network is the estimate of the response.

A further step of the subject method is to shift the complete set of desired frequencies and repeat the whole process. This step could be repeated many times with different shifts to develop a high resolution frequency response that for battery impedance could be comparable to that provided by electrochemical impedance spectroscopy. Thus the subject method can provide capability for both limited frequency response in real time or high resolution frequency response not in real time for periodic system in depth diagnostics.

The system of the subject invention is based on the following theoretical design. The unit under test is excited with a limited sum of sinusoids each at a different frequency that is spread over the range of interest. The magnitude, frequency and phase of each sinusoid making up the sum are known. If the total response of the system is measured via a sample data system at an acceptable sample rate and an adequate duration time record is acquired, then a simple algorithm that uses the known magnitude, frequency and phase of each individual sinusoid will process the single time record. This analysis will obtain the true Bode response at the selected frequencies spread over the range of interest all in parallel. The following synchronous detection analysis is the basis of this simple algorithm. The reference waveform is chosen as a sine as at time zero everything will be at zero.

Equation 1 gives relationship for the parallel excitation.

$$f_{in}(t) = \sum_{i=1}^{M} A_i \sin(\omega_i t + \phi in_i) \tag{1}$$

Equation 2 gives the measured sampled data response of the system $$f_{out}[j] = \sum_{i=1}^{M} B_i \sin(\omega_i (j-1)\Delta t + \phi out_i); \quad j = 1:N \tag{2}$$

Where:
$A_i$ amplitude of the $i^{th}$ input sinusoid
$B_i$ amplitude response of the $i^{th}$ output sinusoid
$\omega_i$ radian frequency of the $i_{th}$ sinusoid
$\Delta t$ time step of data system
$\phi in_i$ phase of the $i^{th}$ input sinusoid
$\phi out_i$ phase response of the $i^{th}$ output sinusoid
N number of points of the response time record
M number of different sinusoids of the excitation time record Each component magnitude and phase of the system response at all the excitation frequencies can be obtained via the following synchronous detection analysis. This analysis quantifies the response at the $k^{th}$ radian frequency $\omega_k$ with the "in phase" and "quadrature" response. The analysis incorporates the feature of discarding a pre-selected number of points R at the beginning of the system response in order to meet the assumption of steady state sinusoidal response. Additionally, for most applications prior to processing the data the mean of the acquired time record should be computed and deleted. The presence of a non-zero mean could corrupt the estimate of the lowest frequency component.

In phase:

$$F_{out_K} = \frac{1}{N-R} \qquad (3)$$

$$\sum_{j=R+1}^{N} \left\{ A_K \sin(\omega_K(j-1)\Delta t + \phi in_K) \sum_{i=1}^{M} B_i \sin(\omega_i(j-1)\Delta t + \phi out_i) \right\}$$

$$F_{out_K} = \frac{1}{N-R} \sum_{j=R+1}^{N} \left\{ \frac{A_K B_K}{2} [\cos(\phi in_K - \phi out_K) - \right. \qquad (4)$$

$$\cos(2\omega_K(j-1)\Delta t + \phi in_K + \phi out_K)] +$$

$$\sum_{i \neq k=1}^{M} \frac{A_K B_i}{2} [\cos((\omega_k - \omega_i)(j-1)\Delta t + \phi in_K - \phi out_i) -$$

$$\left. \cos((\omega_k + \omega_i)(j-1)\Delta t + \phi in_K + \phi out_i)] \right\}$$

$$F_{out_K} = \frac{A_K B_K}{2} \cos(\phi in_K - \phi out_K) \qquad (5)$$

If the time record were infinite the summation over j would average everything to zero except the final result of Equation 5. The quadrature analysis follows in the same Quadrature:

$$Fq_{out_K} = \frac{1}{N-R} \qquad (6)$$

$$\sum_{j=R+1}^{N} \left\{ A_K \cos(\omega_K(j-1)\Delta t + \phi in_K) \sum_{i=1}^{M} B_i \sin(\omega_i(j-1)\Delta t + \phi out_i) \right\}$$

$$Fq_{out_K} = \frac{1}{N-R} \sum_{j=R+1}^{N} \left\{ \frac{A_K B_K}{2} [ \right. \qquad (7)$$

$$\sin(\phi out_K - \phi in_K) + \sin(2\omega_K(j-1)\Delta t + \phi in_K + \phi out_K)] +$$

$$\sum_{i \neq k=1}^{M} \frac{A_K B_i}{2} [\sin((\omega_k + \omega_i)(j-1)\Delta t + \phi in_K + \phi out_i) -$$

$$\left. \sin((\omega_k - \omega_i)(j-1)\Delta t + \phi in_K - \phi out_i)] \right\}$$

$$Fq_{out_K} = \frac{A_K B_K}{2} \sin(\phi out_K - \phi in_K) \qquad (8)$$

Again the summation over j for infinite time record averages everything to zero except the final result of Equation 8. Equations 5 and 8 can be combined to give magnitude and phase for the $k^{th}$ frequency response.

$$|F_{out_K}| = \sqrt{f_{out_K}^2 + fq_{out_K}^2} = \qquad (9)$$

$$\frac{A_K B_K}{2} \underbrace{\sqrt{\sin^2(\phi in_K - \phi out_K) + \cos^2(\phi in_K - \phi out_K)}}_{=1} = \frac{A_K B_K}{2}$$

$$\Box F_{out_K} = \tan^{-1}\left(\frac{Fq_{out_K}}{F_{out_K}}\right) = \tan^{-1}\left(\frac{\frac{A_K B_K}{2} \sin(\phi out_K - \phi in_K)}{\frac{A_K B_K}{2} \cos(\phi out_K - \phi in_K)}\right) = \qquad (10)$$

$$\tan^{-1}\left(\frac{\sin(\phi out_K - \phi in_K)}{\cos(\phi out_K - \phi in_K)}\right) = (\phi out_K - \phi in_K)$$

Equations 9 and 10 give the final results for synchronous detection. This process is repeated for all M of the excitation sinusoids. As stated, the results depend on the time record being infinite in duration. This is not the case and thus the results are in error by leakage from the other components. This error can be reduced without increasing the time record using the following algorithm for compensated synchronous detection (CDS).

The CSD algorithm synthesizes a residual time record of the original time record using the magnitudes of the in phase and quadrature components for each frequency except the one to be detected. This synthesized residual is then subtracted from the original time record. The resulting compensated time record is then processed with synchronous detection and a new compensated estimate of the response at the detection frequency is obtained. Since all of the other components in this compensated time record are suppressed the error from leakage at those other frequencies will be less. This process is repeated for each of the frequencies. Assembling the residual time record and generating the compensated time record are illustrated by Equations 11 and 12.

$$f_{RK}[j] = \sum_{p=1, p \neq K}^{M} (F_p \sin(\omega_p(j-1)\Delta t) + F_{Qp} \cos(\omega_p(j-1)\Delta t)); \qquad (11)$$

$$j = R+1:N$$

$$Cf_{KOut}[j] = f_{Out}[j] - f_{RK}[j] \qquad (12)$$

Where:
$f_{Out}$ is the original time record
$f_{RK}$ is the correction time record
$CfK_{Out}$ is the compensated time record
$F_p$ estimated in phase amplitude response at the $p^{th}$ frequency
$F_{Qp}$ estimated quadrature amplitude response at the $p^{th}$ frequency
$\omega_p$ radian frequency of the $p^{th}$ sinusoid
$\Delta t$ time step of data system
N number of points of the output time record
M number different sinusoids of the excitation function
R number of points of the output time record that are discarded The synchronous detection algorithm described by Equations 1 through 8 is applied to the compensated time record of Equation 12 and better estimates of $F_p$ and $F_{Qp}$ are obtained. This process can be repeated again until the total difference between a completely synthesized time record response and the original time record is minimized.

The following examples are offered to merely illustrate the method of the subject invention and should not be construed as limiting.

EXAMPLE 1

Analytical Testing on a Sum of Sines

The CSD algorithm was evaluated using a simple signal that was assembled from a finite sum of equal amplitude sin waves (Sum of Sines, SOS) with frequencies distributed logarithmically over a limited range. The objective of the analysis was to assess how well the CSD algorithm could pick out the amplitude for each component.

To check out the concept analytically a MATLAB matrix calculation computer software code was written that was a logarithmic mix of 5 equal unity amplitude frequencies ($5^{0.5}$, $5^1$, $5^{1.5}$, $5^2$, $5^{2.5}$ Hz). The acquired time record was set to 10 periods of the lowest frequency and the time step was set to $\frac{1}{10}$ of the period of the highest frequency. As per Equation 9, error-free detection should estimate the amplitude of 0.5 for each component. Table 1 gives the estimate for the first pass or simple synchronous detection and the second pass, the CSD algorithm. The MATLAB matrix calculation computer software code for this analysis is given in Morrison et al., 2005.

TABLE 1

Compensation algorithm analytical results

1st Pass (Simple Synchronous Detection)

| Frequency | $5^{.5}$ | $5^1$ | $5^{1.5}$ | $5^2$ | $5^{2.5}$ |
|---|---|---|---|---|---|
| Amplitude | 0.5060 | 0.5060 | 0.4975 | 0.4988 | 0.5008 |

2nd Pass (CSD Algorithm)

| Frequency | $5^{.5}$ | $5^1$ | $5^{1.5}$ | $5^2$ | $5^{2.5}$ |
|---|---|---|---|---|---|
| Amplitude | 0.5004 | 0.4998 | 0.5004 | 0.5000 | 0.5003 |

As seen in Table 1 analytically, the compensation technique does appear to work as the error for the second pass is much reduced. This initial check of the concept was applied to detect amplitude only and no phase detection. The signal is a sum of equal amplitude sin waves being decomposed into the individual components by the algorithm.

EXAMPLE 2

Analytical Testing of a Low Pass Filter

A recursive model of a second order low pass function was excited with a SOS input signal. The CSD algorithm was then used to estimate the frequency response at each of the specific frequencies making up the SOS.

A spread of 13 specific frequencies was chosen that were spaced in ¼ decade steps starting from 0.1 Hz up to 100 Hz. Using these frequencies a mix of equal unity amplitude sine waves was created. This range of frequencies was picked as the research performed at the Idaho National Laboratory with batteries is over this frequency spread. The signal was discretized with a time step that was 10% of the period of the highest frequency. The length of the time record was set at 10 periods of the lowest frequency.

A recursive model of a second order Butterworth low pass function was developed. The center frequency was set at the middle of the SOS frequency spread. The filter response to the SOS input time profile was computed.

Figure 2:
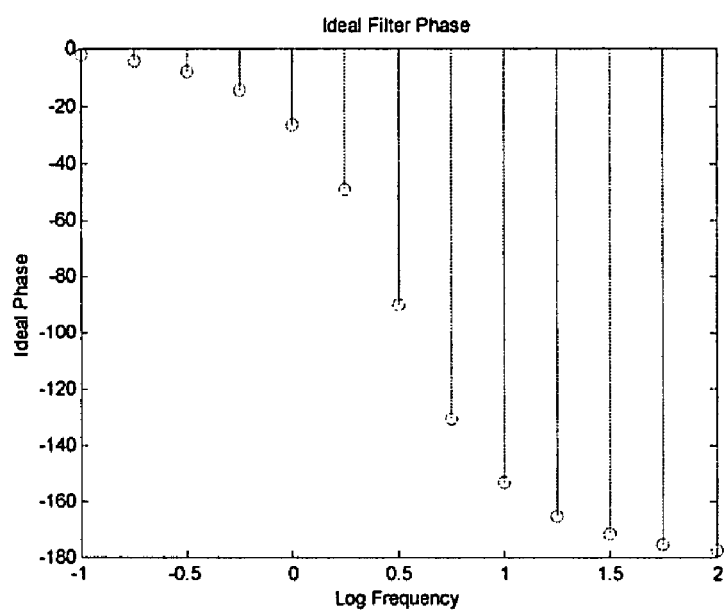
FIG. 2 shows the Filter Ideal Phase Response.
Figure 3:
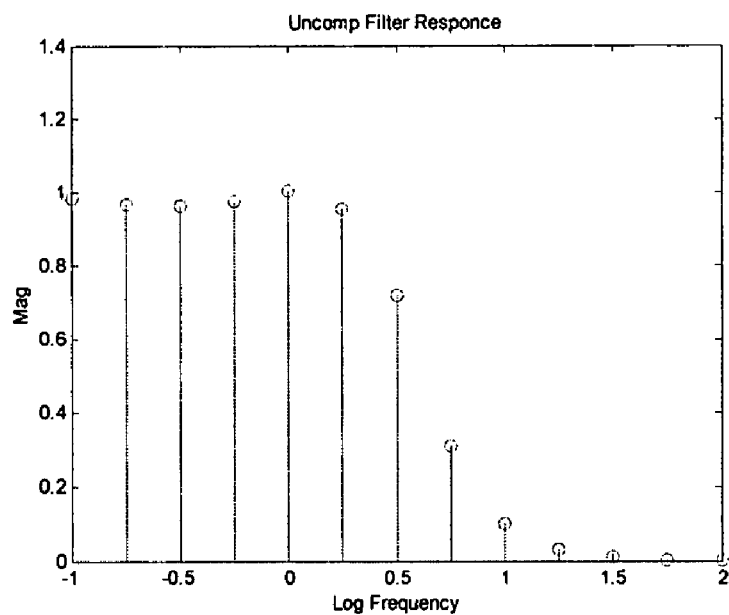
FIG. 3 shows the Filter Uncompensated Synchronous Detected Magnitude Response.
Figure 4:
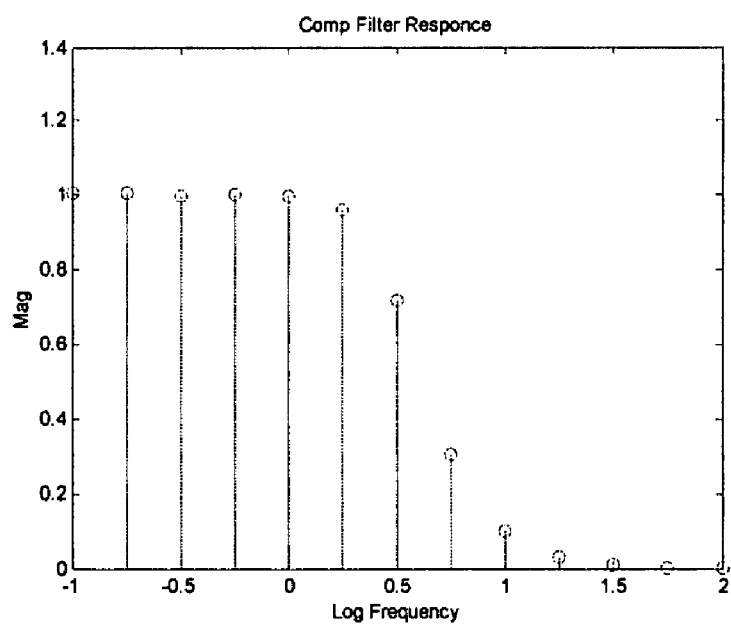
FIG. 4 shows the Filtered Compensated Synchronous Detection (CSD) Magnitude Response.
Figure 5:
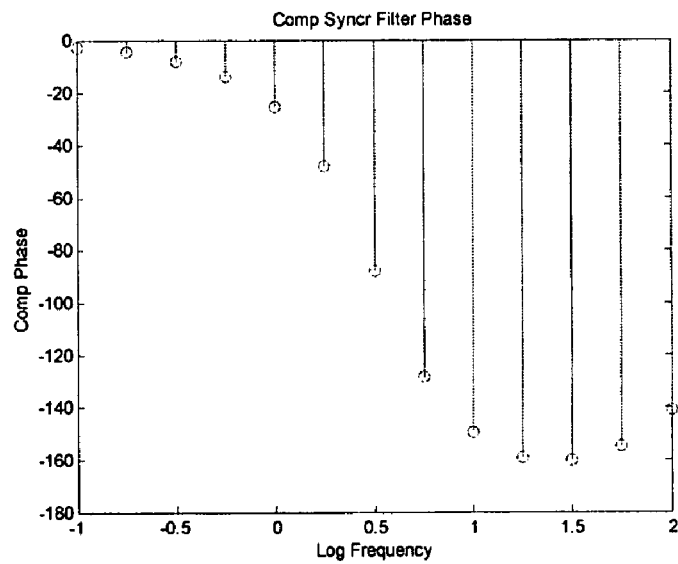
FIG. 5 shows the Filter CSD Phase Response.

Finally, the CSD code was developed to estimate the filter frequency response from the time profile generated by the recursive model code. That code is the implementation of Equations 1 through 12. Additionally, the implementation has the ability to discard a number of user selected points at the beginning of the time profile such that the remaining data better fits the assumption of "steady state" response. The following 6 figures are MATLAB matrix calculation computer software discrete plots of the ideal frequency response, the uncompensated frequency response and finally, the compensated frequency response. All 3 have magnitude plotted against the Log of frequency. The FIGS. 1 and 2 are the ideal magnitude and phase response. FIG. 3 is the uncompensated magnitude response FIG. 4 is the compensated magnitude response. The improvement seen by comparing the last two figures is obvious. FIG. 5 is the compensated phase response. Error at the higher frequencies for the compensated result is likely due to processing a small signal at the high frequencies relative to larger signals at the lower frequencies. The net result is that one time record yields a limited number of points for both magnitude and phase. This technique shows promise for real time applications. The MATLAB matrix calculation computer software code for this analysis is given in Morrison et al., 2005. The next approach will apply the concept analytically in an attempt to identify the impedance of a computer model of a battery.

EXAMPLE 3

Analytical Testing of CSD with a Battery Model

Figure 6:
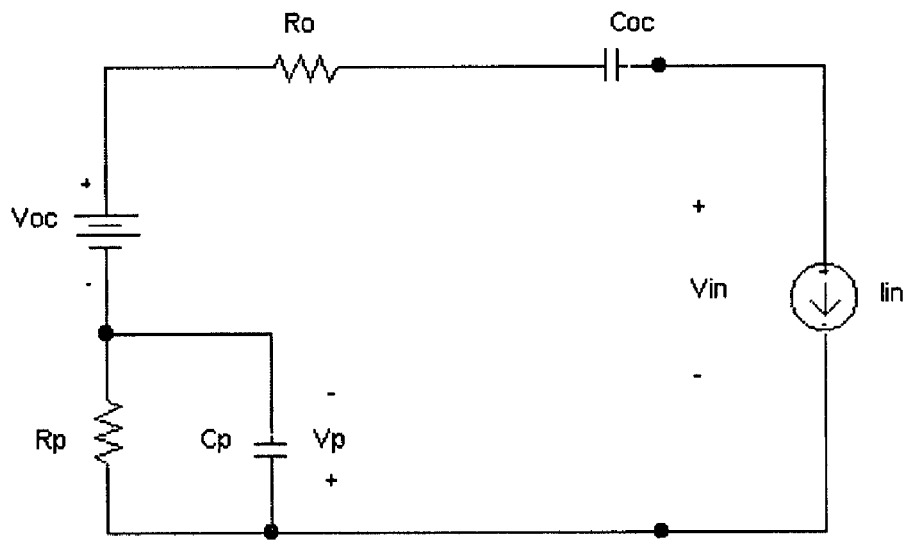
FIG. 6 shows the Lumped Parameter Model (LPM).

The CSD algorithm was evaluated analytically via a computer simulation of the detection of the impedance of the Lumped Parameter Model of a battery (LPM) that was developed by the Idaho National Laboratory (INL) (see, Freedom-Car Battery Test Manual, 2003). A computer model for the LPM that will simulate battery voltage response to an arbitrary battery current was also developed at INL by Fenton et al. 2005. The voltage response of the model normalized to the current in the frequency domain will be the battery impedance. The equivalent circuit for the LPM with parameter identification is given by FIG. 6.

The LPM was excited with a current source $I_{IN}$ that was a SOS and the CSD algorithm was used to identify the impedance seen looking into the LPM over a limited range of discrete frequencies. It should be noted that the polarity of the voltage response was defined as negative because the SOS excitation current was a discharge (negative relative to impedance). The CSD algorithm was used to obtain the frequency response of the LPM. The CSD response magnitude and phase were compared to the ideal response. Initially, the algorithm failed to match ideal impedance. The response of the battery terminal voltage to a discharge SOS current signal will contain a DC term caused by the DC battery voltage. Synchronous detection of any specific frequency in the response will cause a noise frequency in the resultant spectrum at the frequency being detected and, at amplitude of the product of the DC battery voltage and the amplitude of the detection signal. That noise amplitude will be large relative to the signal being detected. Averaging enough cycles in the resultant time record will reject this noise. However, for a real time application the length of the time record needs to be short and not long. The problem was resolved when the mean was deleted from the prediction response of the LPM. The number of frequency lines was set to 13 and they were logarithmically spread from 0.01 Hz to 1.0 Hz. The time record was set to 10 periods of the lowest frequency. In the CSD algorithm no data points were discarded. Table 2 gives the analysis specifics with LPM data that is typical for some Li batteries that INL had recently tested. INL performed the testing per methods in FreedomCar Battery Test Manuals 2003.

TABLE 2

Representative LPM and Analysis Data

| | |
|---|---|
| Voc = 3.8 | |
| Cp = 666.6667 | At Rest |
| Coc = 1.6667e+003 | At Rest |
| Ro = 0.0250 | |
| Rp = .0150 | |
| M = 13 | Number of frequency lines |
| Dt = .01 | Time step, sec |

TABLE 2-continued

Representative LPM and Analysis Data

| | |
|---|---|
| N = 100000 | Total number of points |
| F = .01 | Starting Frequency, Hz |
| FF = 10 | Frequency spread in decades |
| S = .125 | Step size (log) over the decades, 8 steps per decade |
| NN = 10 | Length of time record in number of periods of lowest frequency |

Figure 7:
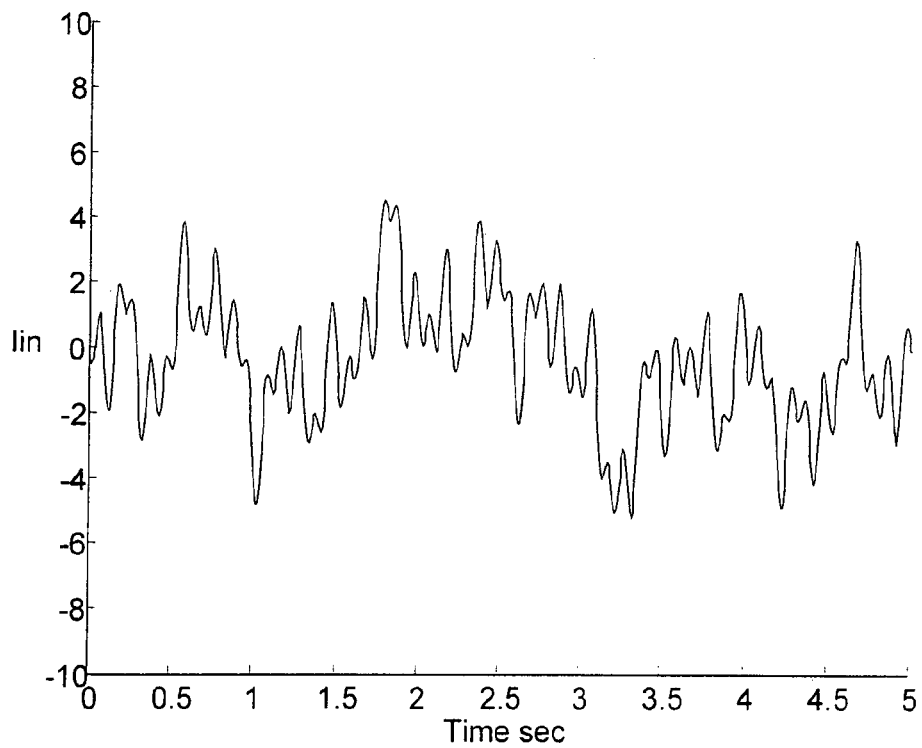
FIG. 7 shows a portion of the Sum of Sines (SOS) signal to LPM 13 lines 10 periods.
Figure 8:
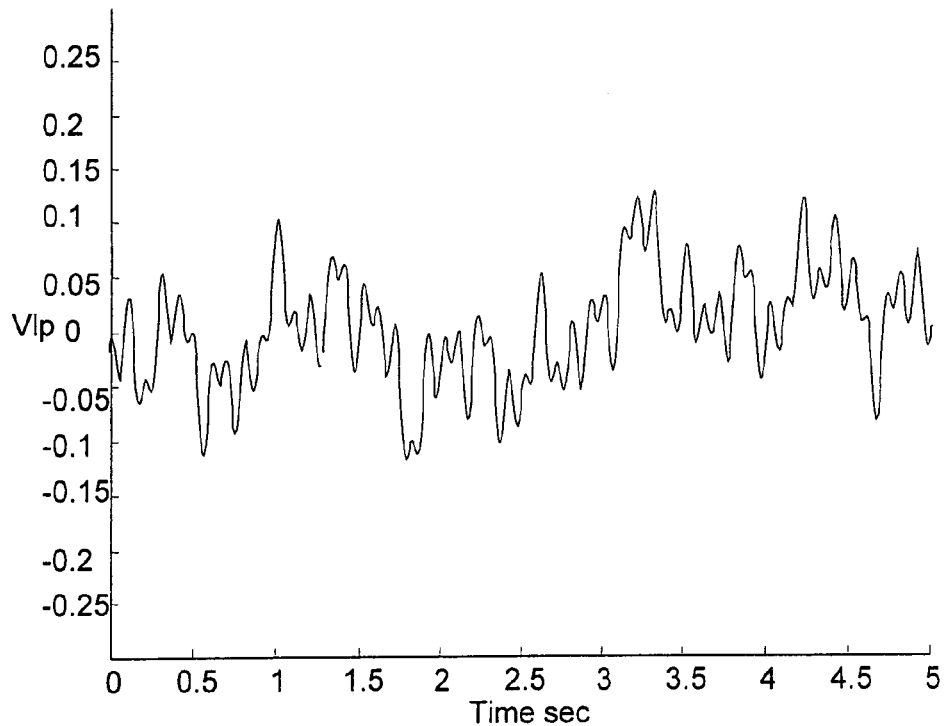
FIG. 8 shows a portion of the LPM time response 13 lines 10 periods.
Figure 9:
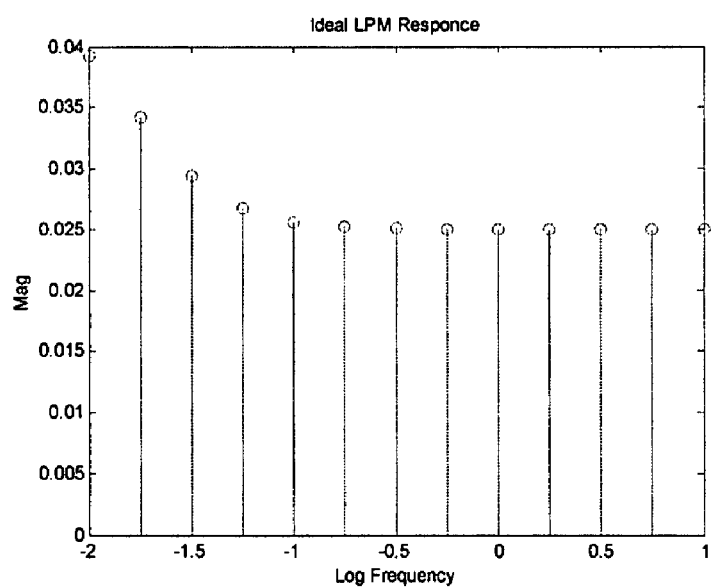
FIG. 9 shows the LPM ideal magnitude response 13 lines 10 periods.
Figure 10:
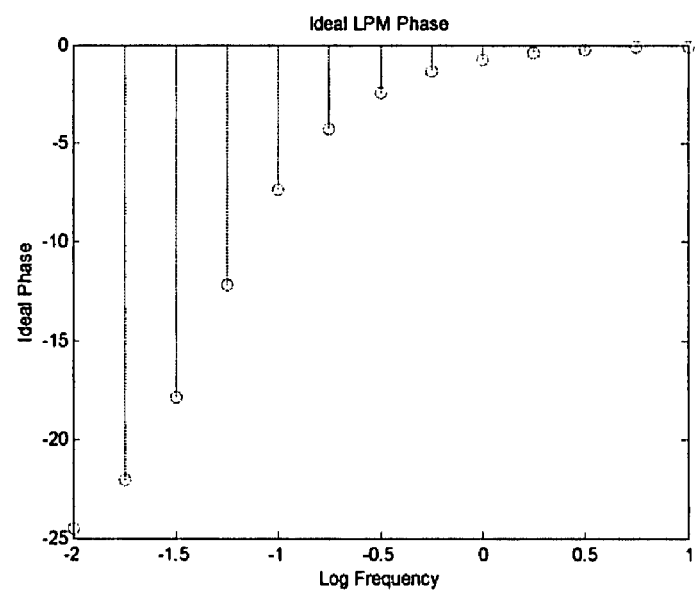
FIG. 10 shows the LPM ideal phase response 13 lines 10 periods.
Figure 11:
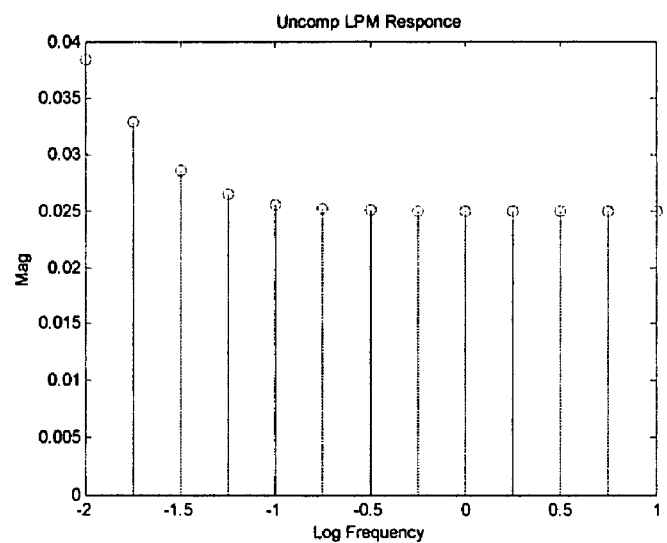
FIG. 11 shows the LPM uncompensated magnitude response 13 lines 10 periods.
Figure 12:
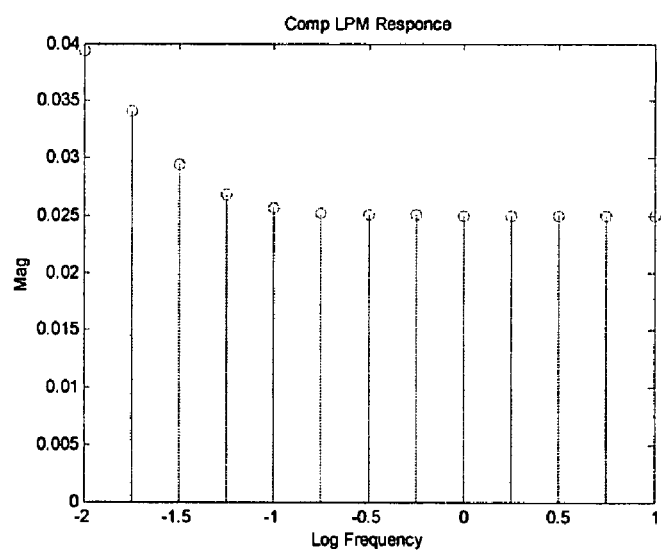
FIG. 12 shows the LPM CSD magnitude response 13 lines 10 periods.
Figure 13:
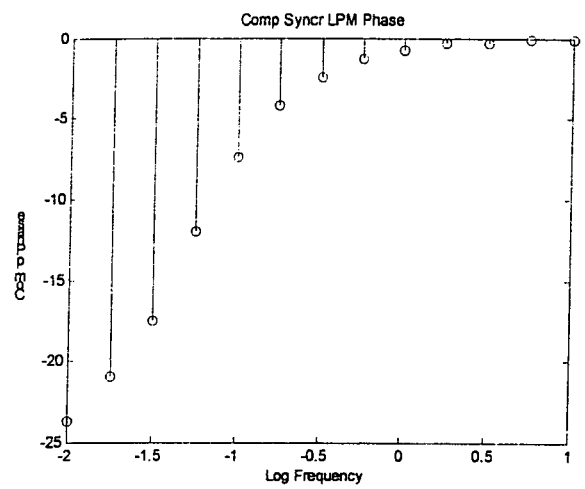
FIG. 13 shows the LPM CSD phase response 13 lines 10 periods.

The following 7 figures are the plots of the analysis results. FIG. 7 is the time record of the SOS current signal. FIG. 8 is the time record of the LPM voltage response. FIGS. 9 and 10 are the LPM ideal impedance magnitude and phase. FIGS. 11 and 12 are the uncompensated and the compensated magnitude response. FIG. 13 is the compensated phase response.

Figure 14:
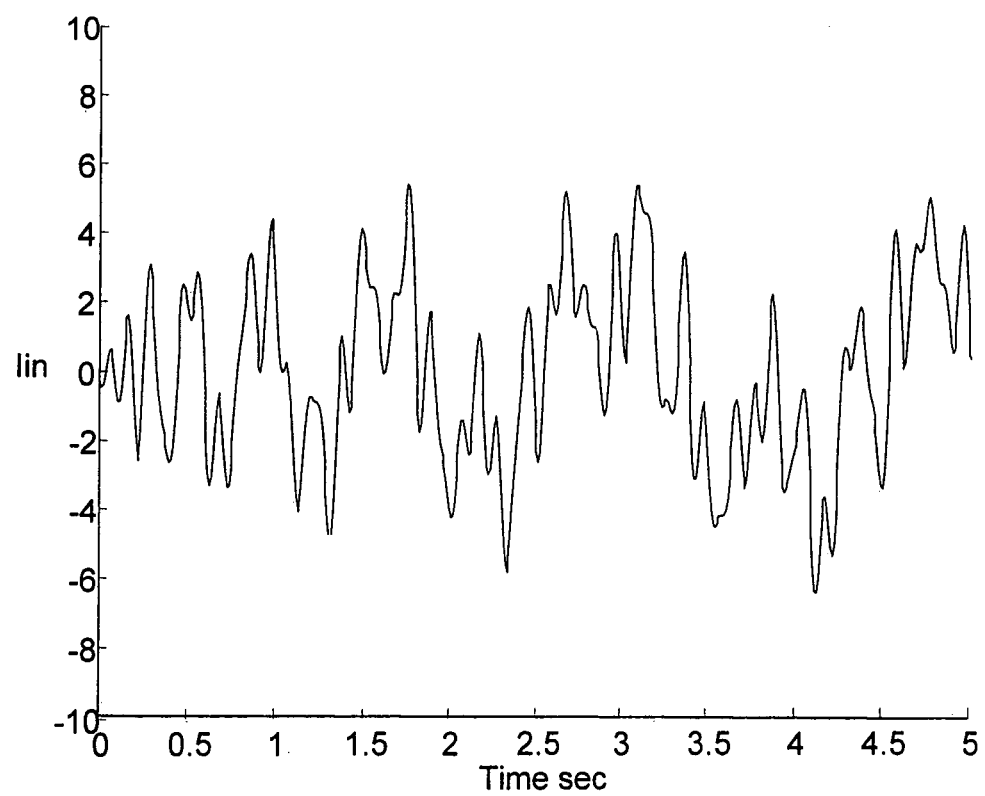
FIG. 14 shows a portion of the LPM SOS signal 25 lines 10 periods.
Figure 15:
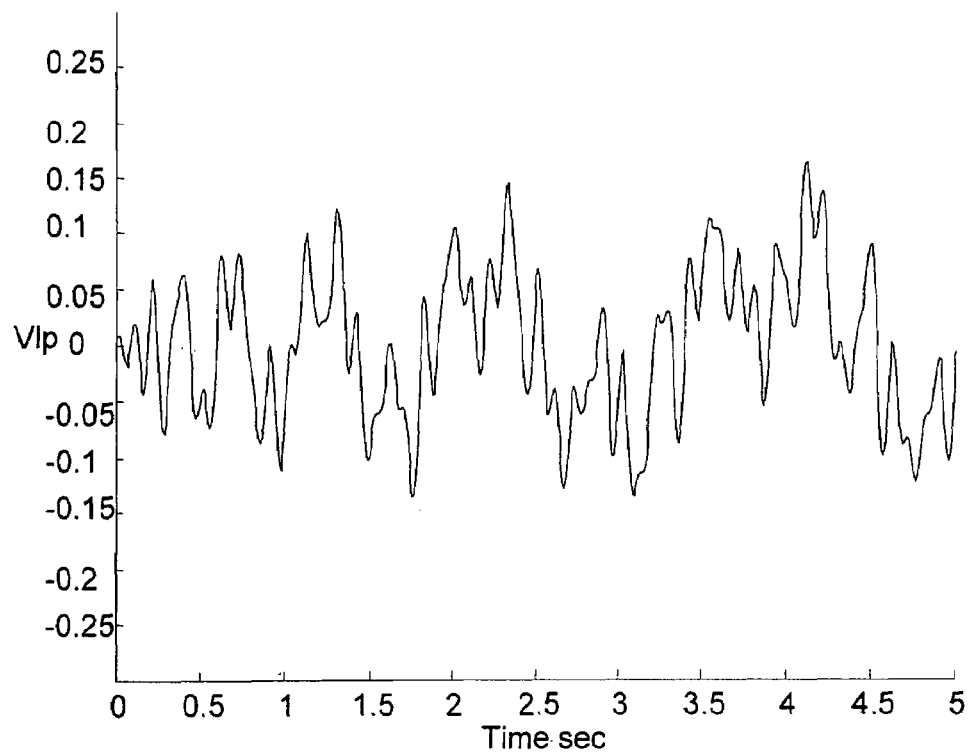
FIG. 15 shows a portion of the LPM time response 25 lines 10 periods.
Figure 16:
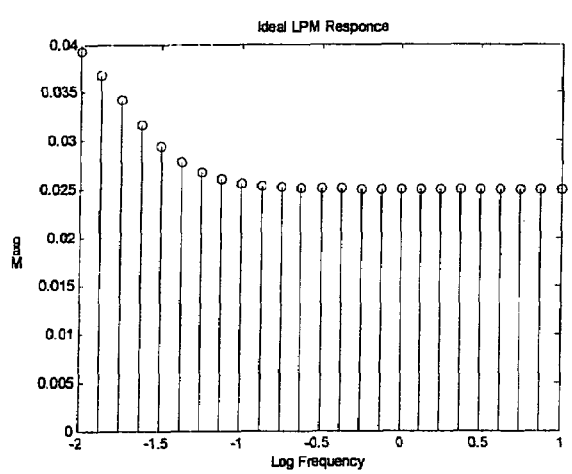
FIG. 16 shows the LPM ideal magnitude response 25 lines 10 periods.
Figure 17:
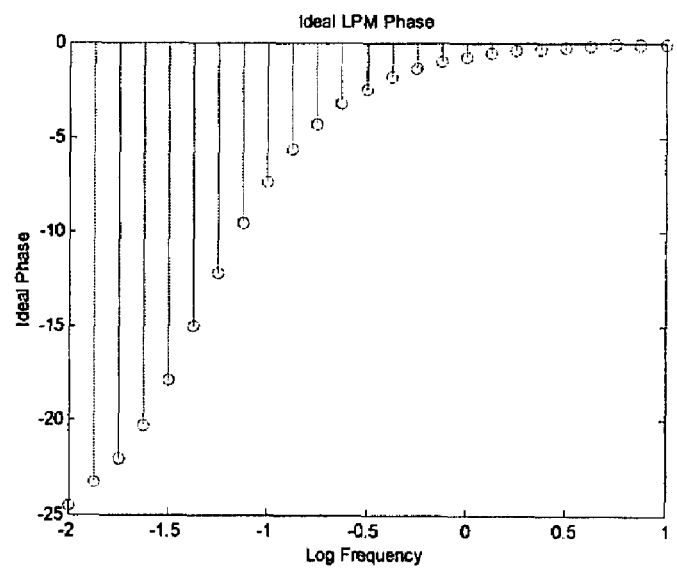
FIG. 17 shows the LPM ideal phase response 25 lines 10 periods.
Figure 18:
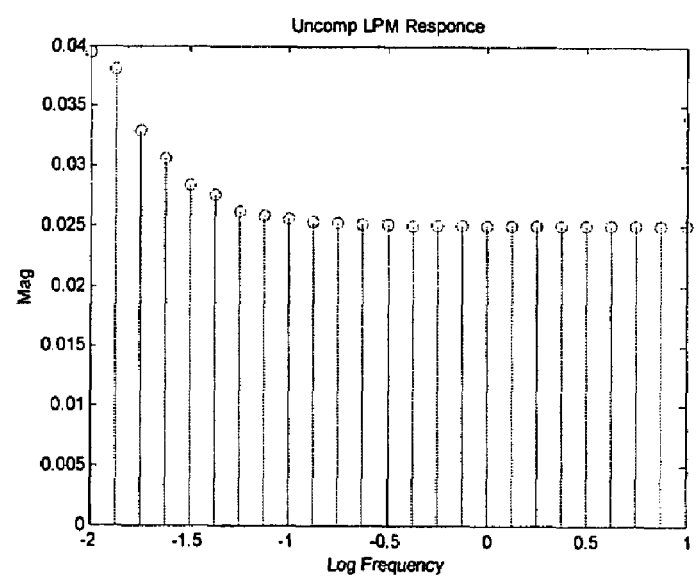
FIG. 18 shows the LPM uncompensated magnitude response 25 lines 10 periods.
Figure 19:
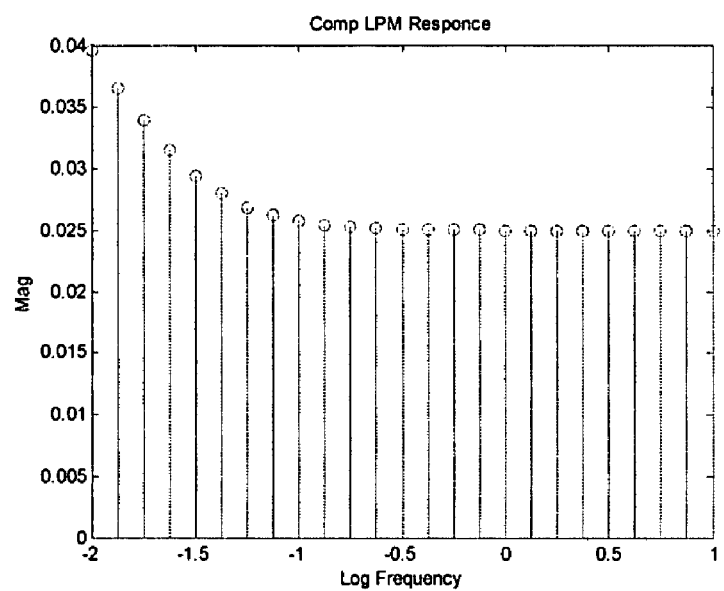
FIG. 19 shows the LPM CSD magnitude response 25 lines 10 periods.
Figure 20:
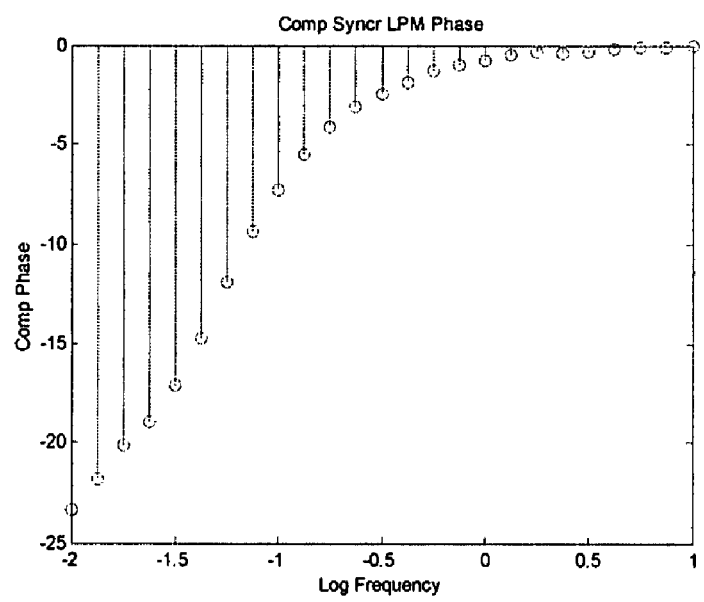
FIG. 20 shows the LPM CSD phase response 25 lines 10 periods.

The number of frequency lines was increased to 25 and everything else left the same. The following 7 figures illustrate the results. FIG. 14 is the time record of the SOS current signal. FIG. 15 is the time record of the LPM voltage response. FIGS. 16 and 17 are the LPM ideal impedance magnitude and phase. FIGS. 18 and 19 are the uncompensated and the compensated magnitude response. FIG. 20 is the compensated phase response.

Additional cases run showed that as the length of the acquired time record in the number of periods of the lowest frequency gets cut back, the number of frequency lines that can be resolved without a big increase in error must be cut back. For example, 5 periods with 25 lines gave terrible results but 5 periods with 13 lines was fine. These positive results are only analytical. Nevertheless, they offer promise of positive expected performance when applied to a physical system. All the MATLAB matrix calculation computer software codes for this analysis are given by Morrison 2005.

EXAMPLE 5

Neural Network Enhanced Synchronous Detection

In order to improve the accuracy of the CSD, studies were conducted upon neural network enhancement of the detection of the individual frequency components of the response of a linear system to a SOS input signal. The concept is very similar to the CSD, with some slight changes and a neural network output layer. For a second order lowpass filter, ordinary synchronous detection performed on the filter response showed a mean squared error (MSE) of $2.6 \times 10^{-3}$. The compensated synchronous detection technique displayed a MSE of $1.6 \times 10^{-3}$. The neural network enhanced synchronous detection showed a MSE of $0.2 \times 10^{-3}$. Results for the lumped parameter model of a lithium ion battery were similar.

The theory of the neural network enhanced synchronous detection is based on the classical synchronous detection and the inherent error associated with time records of finite length.

Given an input signal comprised of a sum of N sinusoids:

$$\hat{x}(t) = \sum_{n=1}^{N} x(\omega_n t)$$

the output of the system would be:

$$\hat{y}(t) = \sum_{n=1}^{N} y(\omega_n t)$$

Being that the input and output are sinusoids, they are assumed to have started at $t=-\infty$ and continues to $t=\infty$. In reality this is not the case, however. The time record of the signal is first of all finite in length and second of all, it is sampled. Given a sampling frequency of at least the Nyquist frequency (twice the highest frequency in the signal), the signal can be reconstructed without error. This does not, however, rectify the finite time length of the signal. Because of this, errors enter into the synchronously detected frequency components.

Synchronous detection involves multiplying the acquired signal by sines and cosines of the desired frequencies and summing the results, as shown below:

$$\alpha_{\omega_n} = \lim_{i \to \infty} \frac{1}{2i} \sum_{j=-i}^{i} y[j] \sin[\omega_n j \Delta t]$$

$$\beta_{\omega_n} = \lim_{i \to \infty} \frac{1}{2i} \sum_{j=-i}^{i} y[j] \cos[\omega_n j \Delta t]$$

The magnitude of a given frequency is obtained as follows:

$$M_{\omega_n} = 2\sqrt{\alpha_{\omega_n}^2 + \beta_{\omega_n}^2}$$

and the phase may also be obtained as follows:

$$P_{\omega_n} = \tan^{-1}\left(\frac{\alpha_{\omega_n}}{\beta_{\omega_n}}\right)$$

where:
  y[j]=the sampled signal,
  α=the sine component of the response for the frequency $\omega_n$
  β=the cosine component of the response for the frequency $\omega_n$.
  Δt=the sample time step.

Notice that the summations are infinite in length. In application, the summation would be from 0 to the length of the recorded signal. If the time record was infinite, then any errors would cancel out. Since our time record is not infinite, errors remain in the calculated response.

It is important to note that an estimate of the original signal can be reconstructed by summing the sine and cosine signals of the different frequencies where each sine signal is multiplied by its sine response component and each cosine signal is multiplied by its cosine response component. The resulting estimate would be exact if the time record was infinite, but since it is of finite length, the reconstructed signal isn't exactly correct. This may be viewed as containing noise.

$$\bar{y}[i] = \sum_{n=1}^{N} \alpha_{\omega_n} \sin(\omega_n i \Delta t) + \beta_{\omega_n} \cos(\omega_n i \Delta t) + \eta[i]$$

where:

η(i)=the noise due to error

Δt=the sample time step i=the ith position in the acquired time record

N=the number of frequency lines

In the compensated synchronous detection approach, this difference between the actual signal and the reconstructed signal is exploited to filter out all but one of the frequencies and increase the accuracy of the measurement (see above). In Neural Network Enhanced Synchronous Detection (NNESD), the approach is slightly different. The premise is that the residual left from subtracting the reconstructed signal from the actual signal still contains some useful information.

$$r[i] = y[i] - \tilde{y}[i]$$

For each frequency of interest, the sine and cosine components are detected on the original signal. These are then used to reconstruct the signal and then stored. The reconstructed signal is then subtracted from the original signal to obtain the residual signal. Synchronous detection is then performed upon this residual signal; once again the sine and cosine components are used to reconstruct the residual signal and also stored. This second residual signal is then subtracted from the first residual signal. This loop continues until a sufficient number (M) of sine and cosine responses are obtained for each frequency. Now the assumption that is made is that there is some functional relationship between these M responses and the true responses.

$$\alpha_{\omega_n,truth} = f(\alpha_{\omega_n 1}, \beta_{\omega_n 1}, \alpha_{\omega_n 2}, \beta_{\omega_n 2}, \ldots, \alpha_{\omega_n M}, \alpha_{\omega_n M})$$

$$\beta_{\omega_n,truth} = f(\alpha_{\omega_n 1}, \beta_{\omega_n 1}, \alpha_{\omega_n 2}, \beta_{\omega_n 2}, \ldots, \alpha_{\omega_n M}, \alpha_{\omega_n M})$$

This functional relationship most likely differs from system to system and also based upon system operating conditions. To deduce what this relationship is for any system would be time consuming. Instead, a generalized regression neural network is implemented to predict the true response.

A Generalized Regression Neural Network (GRNN) is a form of a radial basis neural network suitable for problems involving regression, function estimation, or prediction of a continuous value Wasserman, 1993, Alpaydin, 2004. This is in contrast to a very similar network, the Probabilistic Neural Network, which is used for classification applications. Unlike multi-layer perceptrons, which require training, a GRNN is constructed from a training set of example inputs and the corresponding outputs. The spread of the radial basis function is used to compute the bias. The spread in effect controls the spread of the radial basis function. The example inputs are in the form of an m×n matrix where each of the m rows represents an observation and each of the n columns represents a feature, or parameter. The corresponding example output is an m×1 vector. The input is said to be n-dimensional. The network is divided into 2 layers. The first, or input layer, consists of the example inputs. The output layer consists of the example outputs. The network generates its output in the following manner. The geometric distance is calculated between the newly presented input and each of the example inputs in the input layer:

$$d_m = \sqrt{\sum_{n=1}^{N} (x_n - IW_n)^2}$$

This produces a vector of length m. Each element of the vector is then multiplied by the bias, which is 0.8326/Spread. The vector then goes through the radial basis function.

$$y = e^{-x^2}$$

The radial basis function produces an output that gets closer to 1 as the input gets closer to 0. The resulting vector is a ranking of how close each of the example cases are to the new input. The normalized dot product is then calculated between the vector and the example output vector. This is the network output.

$$y = \frac{1}{M} \sum_{m=1}^{M} x_m L W_m$$

The NNESD is based upon the GRNN approach. Analytical testing will provide preliminary validation of the concept.

Figure 21:
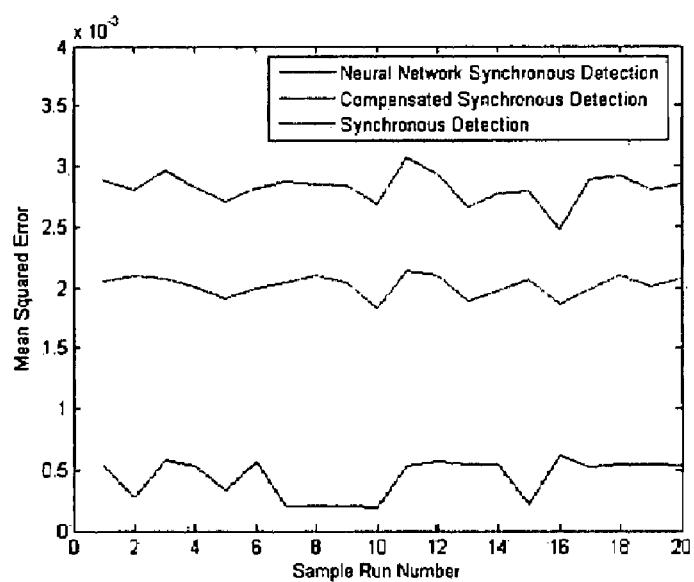
FIG. 21 shows the Mean Squared Error (MSE) comparison for low pass filter frequency response.

The NNESD concept was analytically tested on a $2^{nd}$ order Butterworth filter using the MATLAB matrix calculation computer software BUTTER function and the INL LPM FreedomCar Battery Test Manual, 2003, Fenton et al., 2005 for the lithium ion battery. An SOS input signal was used for both cases. For the filter, the component frequencies were varied for each run in order to build up a training set with 10 component lines to be detected. The filter was run 100 times and the output and target response was calculated. The data was randomized and half of the data was used to construct the GRNN and the other half was used to verify the network. The mean squared error (MSE) of the predicted value was calculated and the process was repeated 20 times, shuffling the data each time. The results are shown in FIG. 21. The MSE of both the standard synchronous detection and the CSD are also shown for comparison. The MATLAB matrix calculation computer software code used for this analysis is given in Morrison, 2005.

Figure 22:
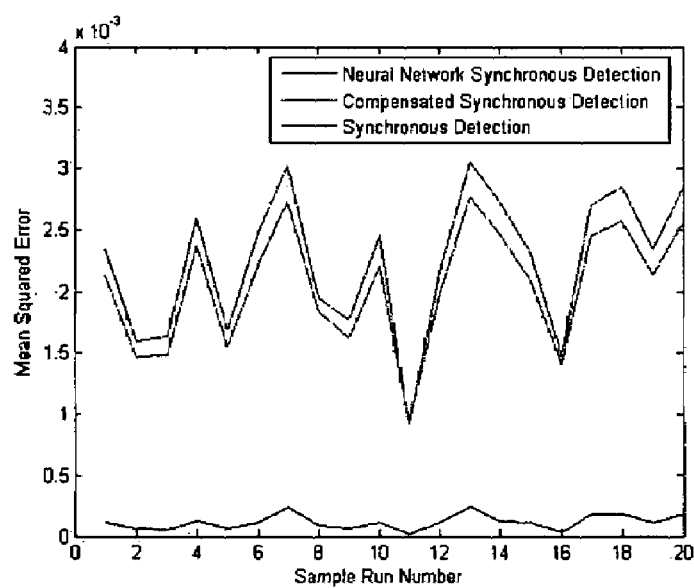
FIG. 22 shows the MSE comparison for detection of LPM impedance.
Figure 23:
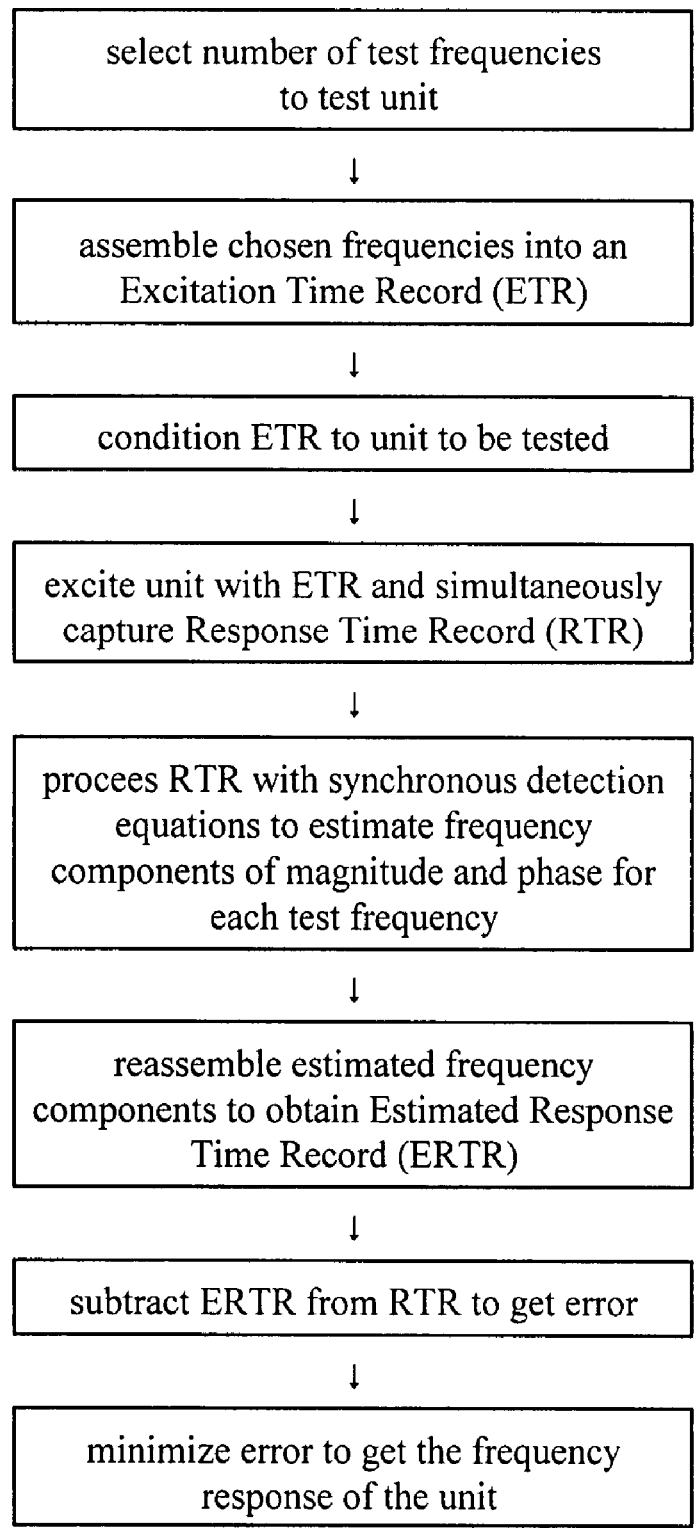
FIG. 23 is a flow chart showing the method of the subject invention.

The technique was then tested on the LPM FreedomCar Battery Test Manual, 2003, Fenton et al., 2005. The input parameters to the model were nominally set as per Table 2 and randomly varied by up to 5% each run for 100 runs to generate the dataset. The number of lines, frequency spread and time step was held as per Table 2. The same training and testing scheme that was outlined above was used. The results are shown in FIG. 22. The MATLAB matrix calculation computer software code used for this analysis is given in Morrison, 2005.

This limited analytical validation has shown that the NNESD concept will significantly reduce the error in the estimate of the frequency components of a given system response signal. This concept allows a parallel implementation for swept frequency measurements to be made utilizing a composite signal of a single time record that greatly reduces testing time without a significant loss of accuracy.

CONCLUSIONS

The physical validation of the CSD or NNESD concept will rely heavily on the work performed by W. Albrecht in his thesis research: "Battery Complex Impedance Identification with Random Signal Techniques" Albrecht, 2005. In this approach, a National Instruments data acquisition and processing system was used along with a custom analog conditioning system. The CSD or NNESD algorithm could be installed directly on that system. The system software will be CSD or NNESD rather than Noise Identification of Battery Impedance (NIBI). The NIBI approach would acquire about 100 time records of the battery response to noise current. Clearly, a time record would have to be of a length of multiple periods of the lowest frequency of interest. The CSD or NNESD approach will acquire one time record of a length of multiple periods (exact number is still to-be-determined) of the lowest frequency of interest. The excitation signal would be generated analytically with software as in the NIBI system. The analytical signal would be preconditioned with a digital low pass filter as in the NIBI system. The CSD or NNESD system may require an analog filter prior to the current driver and after the D/A. This analog filter at the current driver could serve as the prime anti-aliasing filter. This system will use the same bias compensation approach to remove most of the DC battery voltage from the acquired signal. Improved noise rejection and increased sensitivity could be achieved if the voltage sensing were upgrade to full differential via a 4-wire system rather than the 2-wire single-ended system the NIBI used. The increase in sensitivity will enable a reduction in the level of the excitation signal required. It is anticipated that the sampled voltage will be processed directly with the CSD or NNESD algorithm. It is also anticipated that a system calibration would be done exactly as the NIBI system by measuring the impedance of the test leads to determine any system measurement offset and phase shift.

It is understood that the foregoing examples are merely illustrative of the present invention. Certain modifications of the articles and/or methods employed may be made and still achieve the objectives of the invention. Such modifications are contemplated as within the scope of the claimed invention.

REFERENCES

[1] FreedomCar Battery Test Manual, Appendix D DOE/ID-11069 October 2003, Idaho National Laboratory.
[2] Ronald C. Fenton, Justin T. Hohn, Peter M. Willson, BSM Development Documentation Senior Project Final Report for the Idaho National Laboratory, Montana Tech of the University of Montana, May 2005.
[3] W. Morrison, Intelligent Self-Evolving Prognostic Fusion, Phase I STTR Interim Report, Qualtech Systems, Inc., July 2005.
[4] Weston Albrecht, "Battery Complex Impedance Identification with Random Signal Techniques," MS thesis submitted to the Department of General Engineering, Montana Tech of the University of Montana, 2005.
[5] J. Morrison, Algorithms as MATLAB Code for Real Time Estimation of Battery Impedance, Letter report to Qualtech Systems, Inc., Montana Tech. of the University of Montana, September 2005.
[6] R. E. Ziemer, W. H. Tranter, Principles of Communications 5th edition, John Wiley & Sons, 2002.
[7] P. D. Wasserman, Advanced Methods in Neural Computing, New York: Van Nostrand Reinhold, 1993
[8] Alpaydin, Introduction to Machine Learning, Cambridge, Mass., London, England, The MIT Press, 2004.

The invention claimed is:
1. A method for detecting system function of a unit under test by measuring frequency response, the method comprising the steps of:
   (a) selecting a number of frequencies over which the function of the unit under test will be tested;
   (b) assembling an excitation time record that is the sum of the sinusoids of the frequencies and a duration of greater than or equal to a period of the lowest selected frequency;
   (c) conditioning the excitation time record to be compatible with the unit under test;
   (d) exciting the unit under test with the excitation time record and simultaneously capturing a response time record with a data acquisition system;
   (e) processing the response time record using the following synchronous detection equations to obtain estimated frequency components of magnitude and phase for one of the selected frequencies:

$$F_{out_K} = \frac{1}{N-R} \sum_{j=R+1}^{N} \left\{ A_K \sin(\omega_K(j-1)\Delta t + \phi in_K) \sum_{i=1}^{M} B_i \sin(\omega_i(j-1)\Delta t + \phi out_i) \right\}$$

$$F_{out_K} = \frac{1}{N-R} \sum_{j=R+1}^{N} \left\{ \frac{A_K B_K}{2} [ \cos(\phi in_K - \phi out_K) - \cos(2\omega_K(j-1)\Delta t + \phi in_K + \phi out_K)] + \sum_{i \neq k=1}^{M} \frac{A_K B_i}{2} [\cos((\omega_k - \omega_i)(j-1)\Delta t + \phi in_K - \phi out_i) - \cos((\omega_k + \omega_i)(j-1)\Delta t + \phi in_K + \phi out_i)] \right\}$$

$$F_{out_K} = \frac{A_K B_K}{2} \cos(\phi in_K - \phi out_K)$$

$$Fq_{out_K} = \frac{1}{N-R} \sum_{j=R+1}^{N} \left\{ A_K \cos(\omega_K(j-1)\Delta t + \phi in_K) \sum_{i=1}^{M} B_i \sin(\omega_i(j-1)\Delta t + \phi out_i) \right\}$$

$$Fq_{oiut_K} = \frac{1}{N-R} \sum_{j=R+1}^{N} \left\{ \frac{A_K B_K}{2} [ \sin(\phi out_K - \phi in_K) + \sin(2\omega_K(j-1)\Delta t + \phi in_K + \phi out_K)] + \sum_{i \neq k=1}^{M} \frac{A_K B_i}{2} [\sin((\omega_k + \omega_i)(j-1)\Delta t + \phi in_K + \phi out_i) - \sin((\omega_k - \omega_i)(j-1)\Delta t + \phi in_K - \phi out_i)] \right\}$$

$$Fq_{out_K} = \frac{A_K B_K}{2} \sin(\phi out_K - \phi in_K)$$

$$|F_{out_K}| = \sqrt{f_{out_K}^2 + fq_{out_K}^2} = \frac{A_K B_K}{2} \underbrace{\sqrt{\sin^2(\phi in_K - \phi out_K) + \cos^2(\phi in_K - \phi out_K)}}_{=1} = \frac{A_K B_K}{2}$$

$$\angle F_{out_K} = \tan^{-1}\left(\frac{Fq_{out_K}}{F_{out_K}}\right) = \tan^{-1}\left(\frac{\frac{A_K B_K}{2}\sin(\phi out_K - \phi in_K)}{\frac{A_K B_K}{2}\cos(\phi out_K - \phi in_K)}\right) = \tan^{-1}\left(\frac{\sin(\phi out_K - \phi in_K)}{\cos(\phi out_K - \phi in_K)}\right) = (\phi out_K - \phi in_K)$$

Where:
$A_i$ amplitude of the $i^{th}$ input sinusoid
$B_i$ amplitude response of the $i^{th}$ output sinusoid
$\omega_i$ radian frequency of the $i^{th}$ sinusoid
$\Delta t$ time step of data system
$\phi in_i$ phase of the $i^{th}$ input sinusoid
$\phi out_i$ phase response of the $i^{th}$ output sinusoid N number of points of the response time record M number different sinusoids of the excitation time record R the number of points in the response time record that may be discarded K is the frequency index for the system function being detected;

(f) repeating step (e) to obtain estimated frequency components for each selected frequency;

(g) assembling the estimated frequency components to get an estimated response time record;

(h) subtracting the estimated response time record from the captured response time record to get an error; and (i) minimizing the error to achieve the frequency response.

2. The method of claim 1, wherein said error is minimized using the following equations which create a corrected time record and a compensated time record:

$$f_{RK}[j] = \sum_{p=1, p \neq K}^{M} (F_p \sin(\omega_p(j-1)\Delta t) + F_{Qp}\cos(\omega_p(j-1)\Delta t)); \quad (11)$$

$$j = R+1 : N$$

$$Cf_{KOut}[j] = f_{Out}[j] - f_{RK}[j]$$

Where:

$f_{Out}$ is the original time record $f_{RK}$ is the correction time record $Cf_{KOut}$ is the compensated time record $F_p$ estimated in phase amplitude response at the $p^{th}$ frequency $F_{Qp}$ estimated quadrature amplitude response at the $p^{th}$ frequency $\omega_p$ radian frequency of the $p^{th}$ sinusoid $\Delta t$ time step of data system N number of points of the response time record M number of different sinusoids of the excitation time record R number of points of the response time record that may be discarded K is the frequency index for the system function being detected.

3. The method of claim 1, wherein said error is minimized using a neural network.

4. The method of claim 1, wherein said unit under test is a battery.

* * * * *

UNITED STATES PATENT AND TRADEMARK OFFICE
CERTIFICATE OF CORRECTION

PATENT NO. : 7,395,163 B1  
APPLICATION NO. : 11/825629  
DATED : July 1, 2008  
INVENTOR(S) : John L. Morrison et al.

Page 1 of 1

It is certified that error appears in the above-identified patent and that said Letters Patent is hereby corrected as shown below:

On the title page:
In ITEM (75) Inventors:

Please insert new inventors
--Jon P. Christophersen, Idaho Falls, ID (US);
Chester G. Motloch, Idaho Falls, ID (US)--

The revised Item (75) Inventors, will now appear as follows:

--Inventors: John L. Morrison, Butte, MT (US);
William H. Morrison, Manchester, CT (US);
Jon P. Christophersen, Idaho Falls, ID (US);
Chester G. Motloch, Idaho Falls, ID (US)--

On the title page:
In ITEM (73) Assignee:

Please insert new assignees
--Qualtech Systems, Inc., East Hartford, CT (US);
Battelle Energy Alliance, LLC, Idaho Falls, ID (US)--

The revised Item (73) Inventors, will now appear as follows:

--Assignees: Montana Tech of the University of Montana, Butte, MT (US); Qualtech Systems, Inc., East Hartford, CT (US); Battelle Energy Alliance, LLC, Idaho Falls, ID (US)--

Signed and Sealed this
Twenty-third Day of February, 2016

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 7,395,163 B1 | Page 1 of 1 |
| APPLICATION NO. | : 11/825629 | |
| DATED | : July 1, 2008 | |
| INVENTOR(S) | : John L. Morrison et al. | |

It is certified that error appears in the above-identified patent and that said Letters Patent is hereby corrected as shown below:

On the title page:
"In ITEM (73) Assignee:       Please insert new assignees
              --Qualtech Systems, Inc., East Hartford, CT (US);
              Battelle Energy Alliance, LLC, Idaho Falls, ID (US)--

The revised Item (73) Assignees, will now appear as follows:

--Assignees: **Montana Tech of the University of
   Montana, Butte, MT (US); Qualtech Systems, Inc.**,
   East Hartford, CT (US); **Battelle Energy Alliance,
   LLC**, Idaho Falls, ID (US)--"
(as corrected to read in the Certificate of Correction issued February 23, 2016) is deleted and patent is returned to its original state with the applicant & assignee name in patent to read -- (73) Assignee: **Montana Tech of the University of
              Montana**, Butte, MT (US) --

Signed and Sealed this
Seventh Day of June, 2016

Michelle K. Lee
*Director of the United States Patent and Trademark Office*